(12) United States Patent
Brown et al.

(10) Patent No.: US 10,503,202 B1
(45) Date of Patent: Dec. 10, 2019

(54) CLOCK SIGNAL CONTROL

(71) Applicant: Arm Limited, Cambridge (GB)

(72) Inventors: Martin Peter Brown, Sheffield (GB);
Seow Chuan Lim, Letchworth Garden City (GB); Peter Uttley, Nottingham (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/035,920

(22) Filed: Jul. 16, 2018

(51) Int. Cl.
*G06F 1/08* (2006.01)
*G06F 1/10* (2006.01)
*H03L 7/18* (2006.01)

(52) U.S. Cl.
CPC .............. *G06F 1/08* (2013.01); *G06F 1/10* (2013.01); *H03L 7/18* (2013.01)

(58) Field of Classification Search
CPC ..... G06F 1/08; G06F 1/10; G06F 1/12; H03L 7/18; H03L 7/16
See application file for complete search history.

(56) References Cited

U.S. PATENT DOCUMENTS 6,084,441 A * 7/2000 Kawai ................. G06F 1/14
327/115

\* cited by examiner

*Primary Examiner* — Jung Kim
(74) *Attorney, Agent, or Firm* — Nixon & Vanderhye P.C.

(57) ABSTRACT

Clock signal control circuitry comprises a clock selector to output a current clock signal selected from two or more candidate clock signals and to execute a clock signal change operation to select a different one of the two or more candidate clock signals for output as the current clock signal; a counter to generate a count value by counting clock pulses of the current clock signal multiplied by a scaling value; and control logic to execute a scaling value change operation to change the scaling value in response to initiation of a clock signal change operation; in which the clock selector and the control logic are configured to cooperate to inhibit the output of the current clock signal during a scaling value change operation.

11 Claims, 8 Drawing Sheets

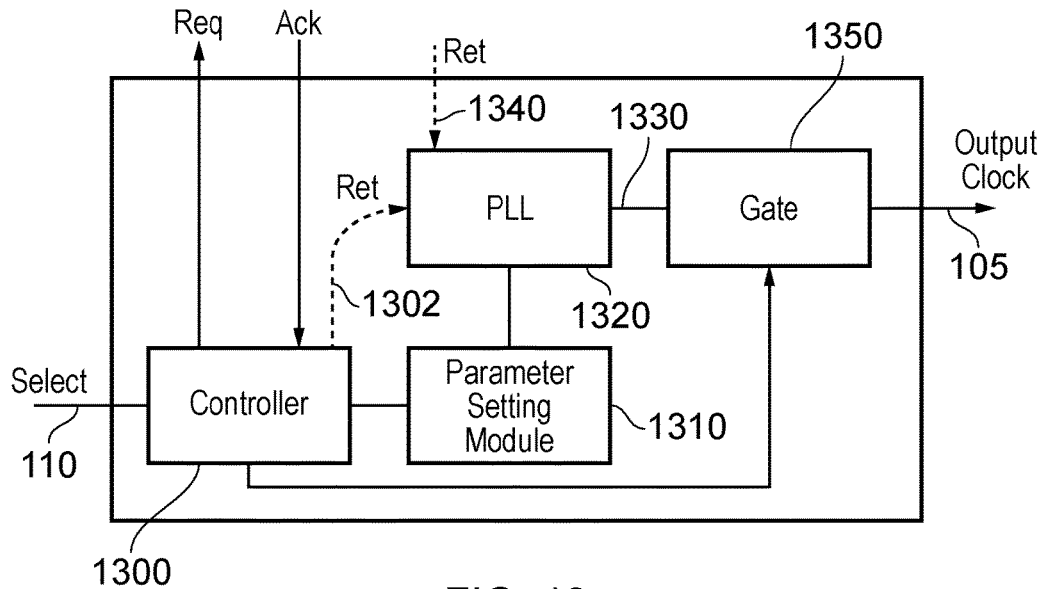
FIG. 13
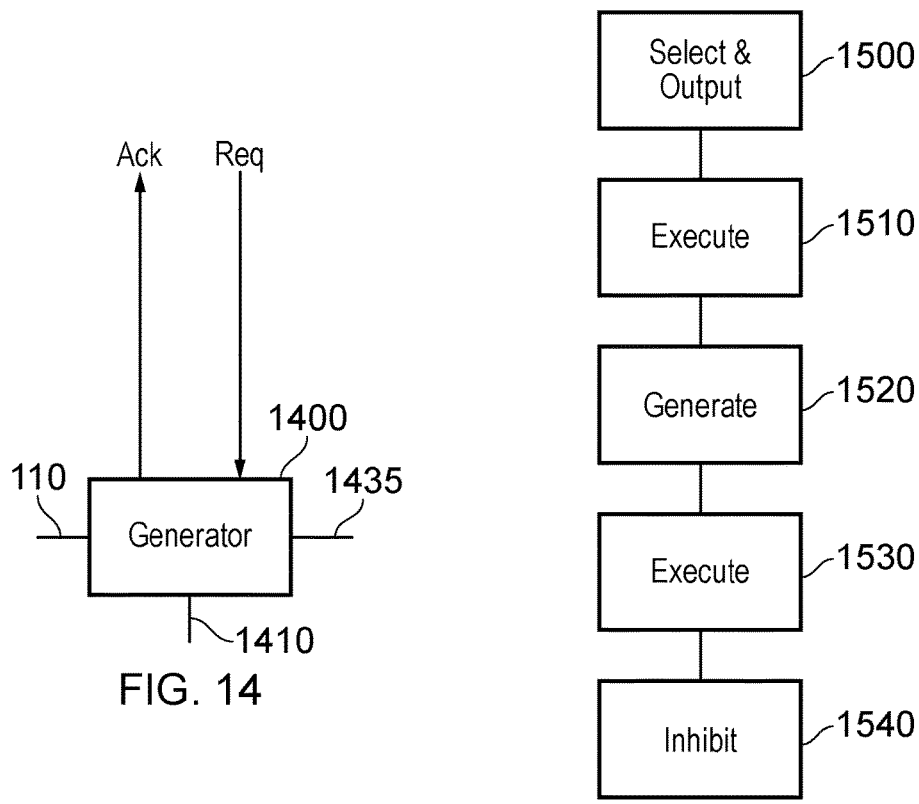
FIG. 14
FIG. 15

CLOCK SIGNAL CONTROL

BACKGROUND

This disclosure relates to clock signal control.

Some examples of data processing circuitry make use of a so-called generic timer architecture which employs a system counter to provide a uniform measure of system time throughout the circuitry. Such a counter can count in proportion to a number of received clock pulses of a system clock signal and provide a "timestamp" dependent upon a current count value.

The count value can typically be distributed to multiple timers and/or "watchdogs". Here a watchdog might be a circuit which detects, for example, a lack of activity by a processing element for a particular period of time, and in the event of such a detection issues a reset or interrupt signal to that processing element. In this way the watchdog circuit can detect (at least the symptoms of) a processing element becoming locked up or suffering a program crash, and initiate action to provide a recovery from that locked up situation.

For systems configured to selectively operate in low power modes, it is known to provide multiple clock signals at different respective clock frequencies. A simple example would be to have a slower reference clock and a selectable faster clock, for example generated from the slower clock by a device such as a phase locked loop (PLL). In a low power mode, the system runs on the slower clock and in a higher performance (but higher power consumption) mode the system runs on the faster clock.

But in both clocking modes a consistent count timestamp is required in order for subsystems or devices which depend on the timestamp (such as the timers and watchdogs discussed above) to operate correctly, such that the timestamp is not affected by changes in clock frequency. Implementing separate counters for each clock domain could require a potentially convoluted procedure to load timestamps from one clock domain to another to maintain a uniform view of system time.

SUMMARY

In an example arrangement there is provided clock signal control circuitry comprising: a clock selector to output a current clock signal selected from two or more candidate clock signals and to execute a clock signal change operation to select a different one of the two or more candidate clock signals for output as the current clock signal;

a counter to generate a count value by counting clock pulses of the current clock signal multiplied by a scaling value; and control logic to execute a scaling value change operation to change the scaling value in response to initiation of a clock signal change operation;

in which the clock selector and the control logic are configured to cooperate to inhibit the output of the current clock signal during a scaling value change operation.

In another example arrangement there is provided clock signal control circuitry comprising:

means for selecting and outputting a current clock signal from two or more candidate clock signals;

means for executing a clock signal change operation to select a different one of the two or more candidate clock signals for output as the current clock signal;

means for generating a count value by counting clock pulses of the current clock signal multiplied by a scaling value;

means for executing a scaling value change operation to change the scaling value in response to initiation of a clock signal change operation; and means for inhibiting the output of the current clock signal during a scaling value change operation.

In another example arrangement there is provided a method comprising:

selecting and outputting a current clock signal from two or more candidate clock signals;

executing a clock signal change operation to select a different one of the two or more candidate clock signals for output as the current clock signal;

generating a count value by counting clock pulses of the current clock signal multiplied by a scaling value;

executing a scaling value change operation to change the scaling value in response to initiation of a clock signal change operation; and inhibiting the output of the current clock signal during a scaling value change operation.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which:

FIG. 13 schematically illustrates another example of a clock selector;

FIG. 14 schematically illustrates another example of increment control logic; and FIG. 15 is a schematic flowchart illustrating a method.

DESCRIPTION OF EMBODIMENTS

Figure 1:
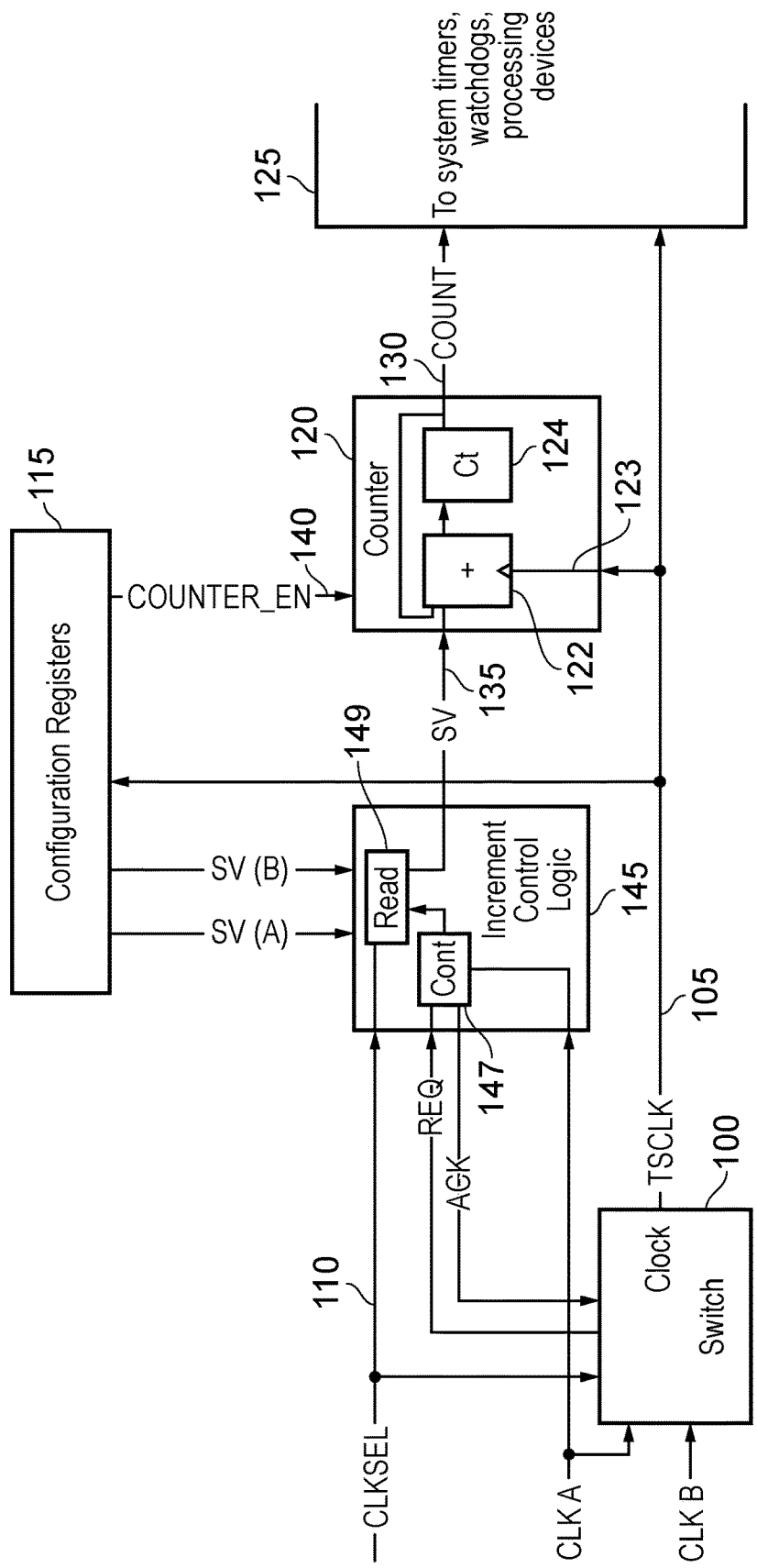
FIG. 1 schematically illustrates a data processing apparatus including clock control circuitry.

Before discussing the embodiments with reference to the accompanying figures, the following description of embodiments is provided.

An example embodiment provides clock signal control circuitry comprising:

a clock selector to output a current clock signal selected from two or more candidate clock signals and to execute a clock signal change operation to select a different one of the two or more candidate clock signals for output as the current clock signal;

a counter to generate a count value by counting clock pulses of the current clock signal multiplied by a scaling value; and control logic to execute a scaling value change operation to change the scaling value in response to initiation of a clock signal change operation;

in which the clock selector and the control logic are configured to cooperate to inhibit the output of the current clock signal during a scaling value change operation.

In the example embodiment, a scaling value can be safely changed in response to initiation of a clock signal change by carrying out the change while the output of the clock signal is inhibited.

In at least some examples, the counting operation of the counter is dependent upon pulses of the current clock signal, so that when the current clock signal is inhibited, no counting takes place.

Although it may be possible to execute a clock signal change itself instantaneously, in example embodiments, to avoid incorrect counting, the clock selector is configured to inhibit the output of the current clock signal during a clock signal change operation.

In example arrangements the circuitry comprises scaling value storage to store two or more candidate scaling values; and the control logic is configured, as at least a part of a scaling value change operation, to provide a selected one of the candidate scaling values to the counter. Again, to avoid incorrect counting, example embodiments are configured to temporarily inhibit operation of the counter during a storage process of storing the two or more candidate scaling values in the scaling value storage.

As part of the circuitry, example embodiments can provide clock generation circuitry to generate the candidate clock signals; in which the clock generation circuitry is configured to define the clock frequencies of the candidate clock signals and to generate the candidate scaling values.

In order to provide a uniform representation of elapsed time irrespective of whatever clock frequency is selected, in example arrangements a respective candidate scaling value corresponds to each of the two or more candidate clock signals; and the candidate scaling values vary in inverse proportion to the clock frequency of the respective candidate clock signals.

In order that the operation of the control logic may continue while the current clock signal is inhibited, in example arrangements the control logic is configured to operate in response to a clock signal which continues during at least a scaling value change operation.

In order to make use of the count and/or clock signals, a data processing circuitry may comprise circuitry as defined above, a processing element to execute successive program instructions; and count processing circuitry to perform a data processing action in response to the count value. In example arrangements the data processing action may comprise one or more of: initiating a processor interrupt; initiating a reset of the processing element; initiating a change in program flow; associating a timestamp with a sensor data packet indicative of a sensor detection; and associating a timestamp with a debug data packet indicative of a current state of the processing element.

Another example embodiment provides clock signal control circuitry comprising:

means for selecting and outputting a current clock signal from two or more candidate clock signals;

means for executing a clock signal change operation to select a different one of the two or more candidate clock signals for output as the current clock signal;

means for generating a count value by counting clock pulses of the current clock signal multiplied by a scaling value;

means for executing a scaling value change operation to change the scaling value in response to initiation of a clock signal change operation; and means for inhibiting the output of the current clock signal during a scaling value change operation.

Another example embodiment provides a method comprising:

selecting and outputting a current clock signal from two or more candidate clock signals;

executing a clock signal change operation to select a different one of the two or more candidate clock signals for output as the current clock signal;

generating a count value by counting clock pulses of the current clock signal multiplied by a scaling value;

executing a scaling value change operation to change the scaling value in response to initiation of a clock signal change operation; and inhibiting the output of the current clock signal during a scaling value change operation.

Referring now to the drawings, FIG. 1 schematically illustrates a data processing apparatus making use of clock signal control circuitry. The apparatus receives two candidate clock signals, the generation of which is not shown in FIG. 1. These candidate clock signals are referred to as CLK A and CLK B. The two clock signals may be synchronous or asynchronous and would generally have different clock frequencies. The selection between clock signals of different clock frequencies allows the apparatus controlled by those clock signals to enter a lower or a higher power mode of operation (given that a lower frequency clock signal is generally associated with lower power operation than a higher frequency clock signal). Purely as an example, CLK A could have a clock frequency of (say) 1 MHz and the signal CLK B could have a frequency of (say) 100 MHz.

A portion of a circuit which operates according to a common clock signal may be referred to as a clock domain. A larger circuit may have multiple clock domains, so that different portions of the circuit can be placed into a lower power mode by selecting a lower speed clock for that clock domain, or into a higher performance, higher power mode by selecting a higher speed clock for that clock domain. Alternatively a particular circuit may be implemented with just one clock domain (so that the entire circuit operates according to a common clock signal) or as multiple clock domains having separately selectable respective clock signals. The example in FIG. 1 represents an example of the processing applicable to a single clock domain.

A clock switch 100 acts as a clock selector to output a current clock signal 105 ("TSCLK") selected from the two or more candidate clock signals CLK A and CLK B, under the control of a clock selection signal 110 ("CLKSEL"). The current clock signal 105 output by the clock switch 100 is provided to a set of configuration registers 115, a counter 120 and various (unspecified in FIG. 1 but described separately below) system timers, watchdogs or other processing devices 125.

The counter 120 generates a count value 130 dependent upon pulses of the current clock signal 105 multiplied by a scaling factor or scaling value (SV) 135. Separately, the counter 120 is enabled or disabled by an enable signal 140 provided by the configuration registers 115 in response to a value held in a particular register of the configuration registers 115. In this way, it is possible to enable or disable the operation of the counter 120 by writing an appropriate value to that one of the configuration registers.

The counter may be, for example, an 88 bit wraparound counter. In the present example, a 64 bit timestamp is distributed as the counter output to the devices using the timestamp, so that the count values increase until they reach an upper limit of $2^{64}-1$ (about $2\times10^{19}$), at which point they wraparound to zero again. The remaining bits of the physical 88 bit counter allow for a 32 bit scaling value representing 8 bit integers with 24 bit fractional values, so allowing for a potential fractional increment of the timestamp.

In a schematic example, the counter 120 comprises an adder 122 which adds together the scaling value 135 and the current count value (held by a register 124), the arrangement being clocked by a clock input 123 such that an addition operation is initiated in response to a clock pulse of the clock signal 105.

The scaling value 135 is provided to the counter 120 by increment control logic 145. At any counting operation, driven by receipt (by the counter) of a clock pulse of the clock signal 105, the counter applies the prevailing scaling value 135 currently being provided as an output of the increment control logic 145.

The increment control logic 145 is arranged to execute a scaling value change operation to change the scaling value 135 provided to the counter 120 in response to the initiation of a clock signal change operation by the clock switch 100 to select a different one of the two or more candidate clock signals for output as the current clock signal 105.

Here, the scaling value can be changed, for example, to provide a uniform record of time using the count value 130. In at least some example embodiments, there is a respective candidate scaling value corresponding to each of the two or more candidate clock signals CLK A and CLK B and the candidate scaling values vary in inverse proportion to the clock frequency of the respective candidate clock signals.

In an example using the figures discussed above, the following scaling values may be used:

| Clock frequency | Scaling Value |
|---|---|
| 1 MHz | 100 |
| 100 MHz | 1 |

In this way, if the currently selected clock is the 1 MHz clock, the count value advances by 100 at each clock pulse. if the currently selected clock is the 100 MHz clock, the count value advances by 1 for each clock pulse, but of course there will be 100 such clock pulses in a single clock pulse period of the 1 MHz clock. So, the inverse proportionality mentioned above provides a uniform measure of elapsed time whichever clock frequency is in use.

In another example consistent with the same principle of inverse proportionality, the following values may be used:

| Clock frequency | Scaling Value |
|---|---|
| 1 MHz | 2000 |
| 100 MHz | 20 |

The increment control logic 145 and clock switch 100 interact using two control signals, Req and Ack. The Req signal is provided from the clock switch 100 to the increment control logic 145 and the Ack signal is provided from the increment control logic 145 to the clock switch 100. The increment control logic 145 is also responsive to the clock selection signal 110.

Using techniques to be discussed in more detail below, the clock switch 100 and the increment control logic 145 are configured to cooperate so as to inhibit output of the current clock signal 105 during a scaling value change operation. In this way, the counter 120 stops counting during the period in which the output of the current clock signal 145 is inhibited (because even when the counter 120 is enabled by the enable signal 140, it counts only in response to received clock pulses, so if the received clock pulses are currently inhibited, it does not count), allowing the opportunity for the increment control logic 145 to place the newly selected scaling value 135 at its output, forming the scaling value 135 which will be used by the counter 120 at its next counting operation, when the clock signal 105 is re-enabled. This therefore provides a safe transition between scaling values at a clock frequency transition.

In fact, in at least some embodiments, the clock switch 100 is configured also to inhibit the output of the current clock signal 105 during a clock signal change operation. However, this is not essential (the clocks could be synchronous so that a very rapid switch could in principle be made by the clock switch 100) but the inhibition of the output of the current clock signal during the scaling value change operation can avoid incorrect counting by the counter 120, or in other words can avoid the wrong scaling value being used to count the current clock signal 105.

Figure 2:
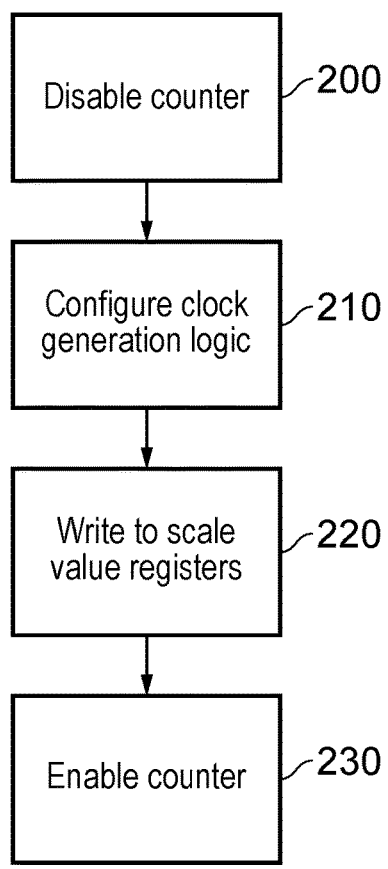
FIG. 2 is a schematic flowchart illustrating a method.

FIG. 2 is a schematic flowchart illustrating a method of initially populating the configuration registers 115. The method of FIG. 2 may be carried out by control software running on a processing element not shown in FIG. 1 and/or by control circuitry of a type to be discussed with reference to FIG. 7 below.

At a step 200, the counter 120 is disabled by writing a disabling value (such as a zero) to a register in the configuration registers 115 which stores the enable signal 140. As discussed above this inhibits the operation of the counter 120.

At a step 210, logic or circuitry to generate the candidate clocks such as CLK A and CLK B is configured. This may involve establishing parameters which determine the clock frequencies of the candidate clocks.

At a step 220, appropriate values for each candidate clock are written to the configuration registers as candidate scaling values. The example values given above may be used.

Finally, at a step 230 an enabling value (such as a one) is written to the register storing the counter enable signal 140 so as to restart the operation of the counter 120. In this regard, note that the counter 120 is responsive to the current clock signal 105 and operates to generate a count value in response to a pulse of the current clock signal 105. At periods of time when the output of the current clock signal 105 is inhibited (for example, during a scaling value change operation and/or in some examples during a clock signal change operation) then a counter is not operational even if the enable signal 140 is currently enabling operation of counter 120.

Figure 3:
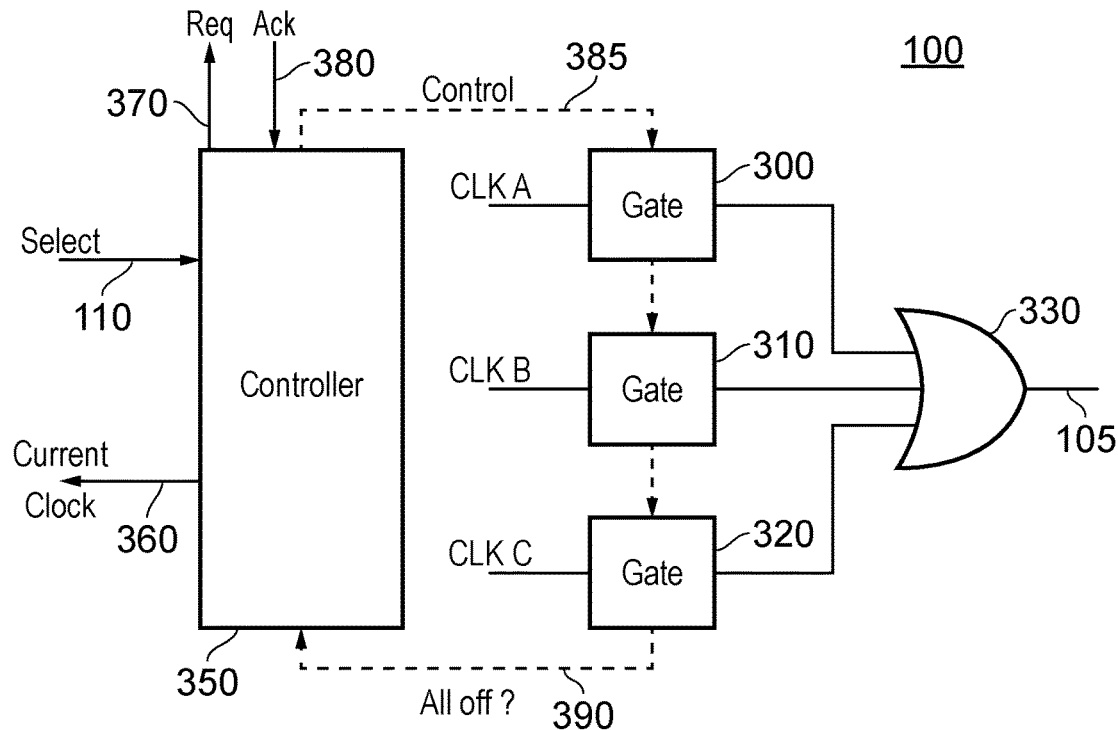
FIG. 3 schematically illustrates a clock switch.

FIG. 3 schematically illustrates a clock switch for use as the clock switch 100. The example clock switch of FIG. 3 is configured to receive three candidate clock signals, CLK A, CLK B, CLK C in this example, although the arrangement is scalable to any number of two or more candidate clocks. Each of these candidate clock signals is provided to a respective clock gate 300, 310, 320 which selectively passes or inhibits passage of the respective clock signal to an OR gate 330 which combines the outputs of the three respective clock gates to generate the output clock signal 340.

The clock gates 300 . . . 320 are under the control of a controller 350 which is responsive to the clock select signal 110. The controller 350 generates a "current clock" signal 360 (to be discussed further below), generates the request signal Req 370 and receives the Ack signal 380. The controller also generates control signals 385 to control the clock gates 300 . . . 320 and receives status signals 390 from the clock gates 300 . . . 320.

Figure 4:
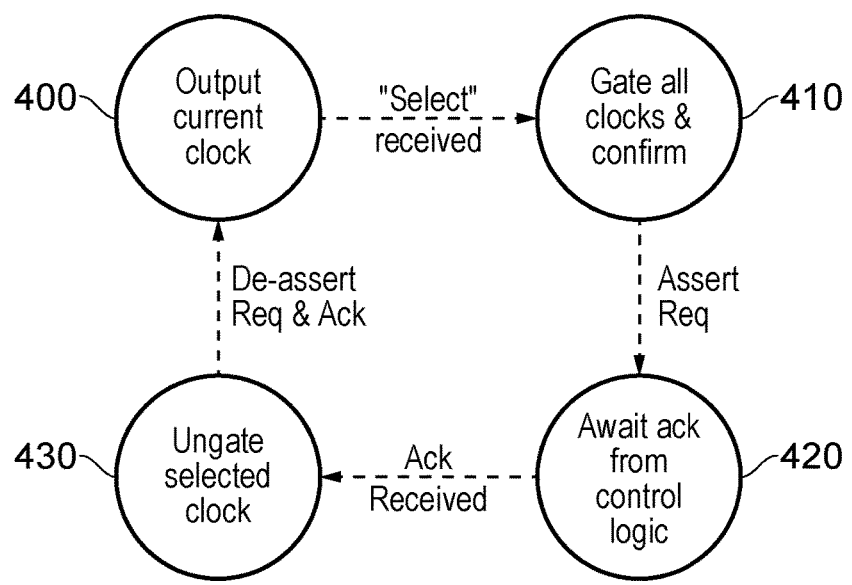
FIG. 4 schematically illustrates a part of the operation of the clock switch of FIG. 3.

The controller may, in some examples, operate as a so-called state machine such that it may occupy a current one of a number of available states, with combinations of the input and output signals being defined to allow transition between states. FIG. 4 provides an example simplified state diagram illustrating this type of technique.

Starting from a state indicative of normal operation, a state 400, a current clock signal 105 is being output by the clock switch 100. Assume then that a selection of a different clock signal is received as the clock select input 110. Control moves to a state 410 at which all of the clocks CLK A, CLK B, CLK C are gated or inhibited by the control signal 385 being provided to the three clock gates 300 . . . 320. The system stays in the state 410 until confirmation is received via the control signal 390 that all of the gates are off, so that there is no currently output clock signal at the output 105, or in other words the output of a clock signal is inhibited during the clock signal change operation.

The controller 350 then asserts the Req signal 370 which is provided to the increment control logic 145 and moves to a state 420 at which the controller 350 awaits an acknowledgement by the Ack signal 380 from the increment control logic 145. During this period, the clock gates 300 . . . 320 are all gated or switched off, providing an example in which the output of the current clock signal 105 is inhibited during a scaling value change operation.

Separately the increment control logic 145 initiates the scaling value change operation in response to the Req signal 370 and send the Ack signal 380 when it is finished that operation. The increment control logic uses the clock selection signal 110 to indicate which of the scaling values should be used, but waits for the Req signal to actually initiate the change of scaling value.

In response to receipt of the Ack signal control moves to a state 430 at which the newly selected clock signal is enabled by its respective gate (one of the gates 300 . . . 320) being switched on, under the control of the control signals 385. The Req signal is then de-asserted by the controller 350 and in response, the increment control logic 145 de-asserts the Ack signal allowing the system to revert to the state 400 in which the newly selected clock signal is output as the current clock signal. In response to de-assertion of the Ack signal, the controller changes the "current clock" signal 360 to indicate the identity of the newly selected clock and by doing this to indicate that the transition to the newly selected clock has been completed.

Figure 5:
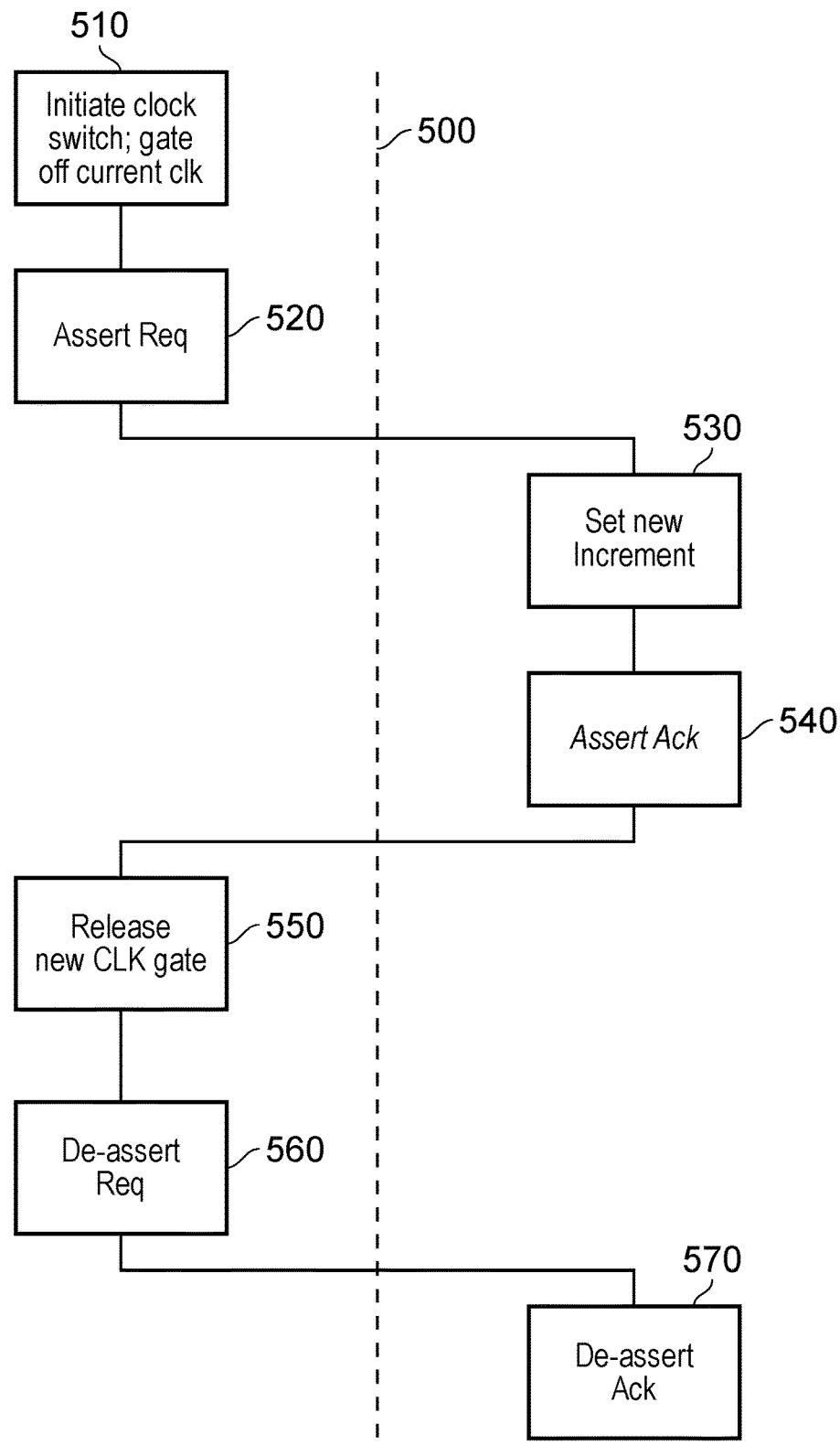
FIG. 5 is a schematic flowchart illustrating a method.

FIG. 5 is a schematic flowchart illustrating a method. In FIG. 5, steps illustrated to the left of a vertical broken line 500 are performed by the clock switch 100 of FIG. 1 and steps to the right of the broken line 500 are performed by the increment control logic 145 of FIG. 1.

At a step 510, the clock switch 100 initiates a clock switch operation and gates off the current clock (so that there is no current clock signal 105 being output). At a step 520, the clock switch 100 asserts the Req signal 370.

At a step 530, the increment control logic 145 sets a new increment value and provides this to the counter as the value of 135. It does this by reading the newly required scaling value from the configuration registers 115 and routing it to the output scaling value 135. Therefore, this is an example of the configuration registers 115 providing scaling value storage to store two or more candidate scaling values (SV(A) and SV(B) in FIG. 1) and in which the increment control logic is configured, as at least a part of a scaling value change operation, to provide a selected one of the candidate scaling values to the counter as the value SV 135. The increment control logic can achieve this in example arrangements by a controller 147 controlling operation of read circuitry 149 to read the scaling value appropriate to the newly selected clock (specified by the signal 110) from the configuration registers 115 and providing it as the output 135. The controller 147 operates in response to the assertion of Req and provides Ack as discussed when the update is finished.

Note that the increment control logic 145 operates under the control of a clock source (an ungated CLK A in this example) which continues during at least a scaling value change operation. Note also that the configuration registers (storing the scaling values and/or the enable signal) can be read by the increment control logic 145 even when the configuration registers do not have an active clock source. A clock signal is required only for writing to the configuration registers.

Note also that as discussed above, while the current clock signal 105 is not being provided (because it is inhibited as discussed above during at least a scaling value change operation), the counter 120, albeit enabled, is not carrying out any counting function so it is safe to change the scaling value 135 at this stage.

At a step 540 the increment control logic 145 asserts the Ack signal 380, in response to which at a step 550 the clock switch 100 releases the clock gate corresponding to the newly selected clock and de-asserts the Req signal at a step 560. The clock signal 105 restarts and counting resumes but with the newly changed scaling value 135.

In response to this de-assertion, the increment control logic de-asserts the Ack signal at a step 570. As mentioned above the de-assertion of the Ack signal can be used to affect the generation of the current clock signal 360 of FIG. 3, using a technique to be discussed below.

Figure 6:
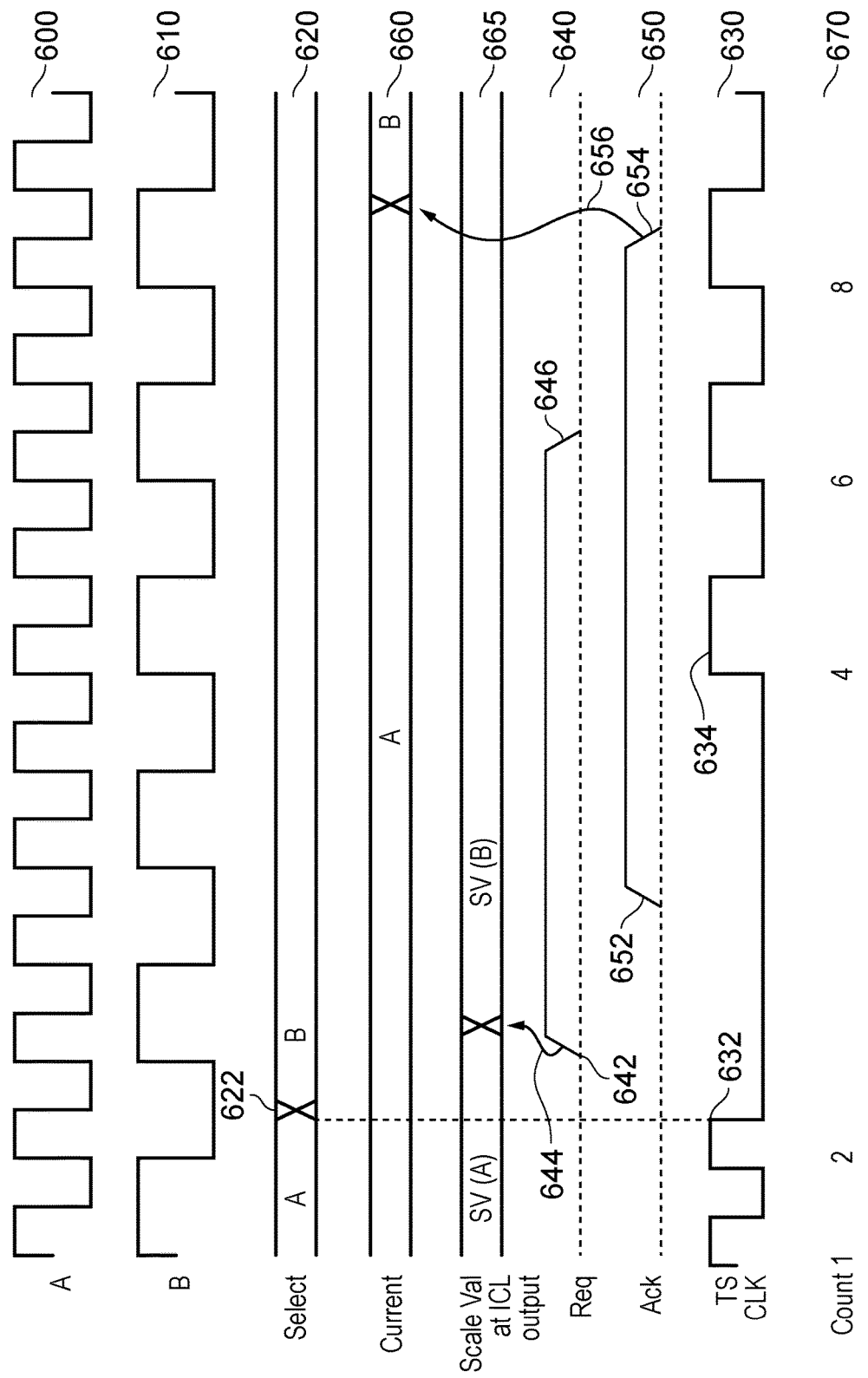
FIG. 6 is a schematic timing diagram.

FIG. 6 is a schematic timing diagram illustrating some of the operations discussed above, for example by the clock switch 100, the increment control logic 145 and the counter 120.

In the example of FIG. 6, two candidate clock signals, A and B are provided. In the example, these are synchronous and also the clock signal A has twice the frequency of the clock signal B. These are shown as upper rows 600 (clock signal A) and 610 (clock signal B) in FIG. 6.

A row 620 schematically illustrates the select signal 110 of FIG. 1, which is initially set to specify the clock signal A and at a point 622 changes to select the clock signal B.

Moving to the penultimate row 630 of FIG. 6, the current clock signal 105 is initially dependent upon the candidate clock signal A until a time 632 corresponding to the change in the select signal from the clock signal A to the clock signal B. At this point, the controller 350 of FIG. 3 moves from the state 400 of FIG. 4 to the state 410 and gates off all of the output clocks so that output of the current clock signal 105 is inhibited.

Referring to a row 640 representing the Req signal 370 of FIG. 3, the controller 350 asserts the Req signal at a point 642. In response to this, as indicated by the schematic arrow 644, the increment control logic 145 reads out the scaling value SV (B) corresponding to the newly selected clock specified by the select signal 110 and provides this as its output 135 (as represented by the row 665). When it has done this, it asserts the Ack signal 380 (as shown in a row 650 at a point 652.

Between the assertion of the Req signal and the reply assertion of the Ack signal, the controller 350 of FIG. 3 weights in the state 420 and output of the current clock signal 105 is inhibited. Upon receipt of the Ack assertion at the point 652, the controller 350 can move to the state 430 and then, having restarted the newly selected clock at a point 634 (the candidate clock signal B) de-asserts the Req signal at a point 646. As an acknowledgment, the increment control logic 145 de-asserts the Ack signal at a point 654. As shown by a schematic arrow 656, an effect of this is that the controller 350 sets the current clock output (shown in a row 660 to the newly selected clock, the clock signal B.

Referring to a bottom row of FIG. 6, a row 670, count values implemented by the counter 120 using an example scaling value S V (A) of 1 and an example scaling value S V (B) of 2 are shown so that for each clock pulse of the clock A in the initial period shown in FIG. 6, the count advances by 1 but for each clock pulse of the clock signal B in the latter part of FIG. 6, the count advances by 2, noting that these clock pulses occur half as frequently as the clock pulses of the clock signal A.

Figure 7:
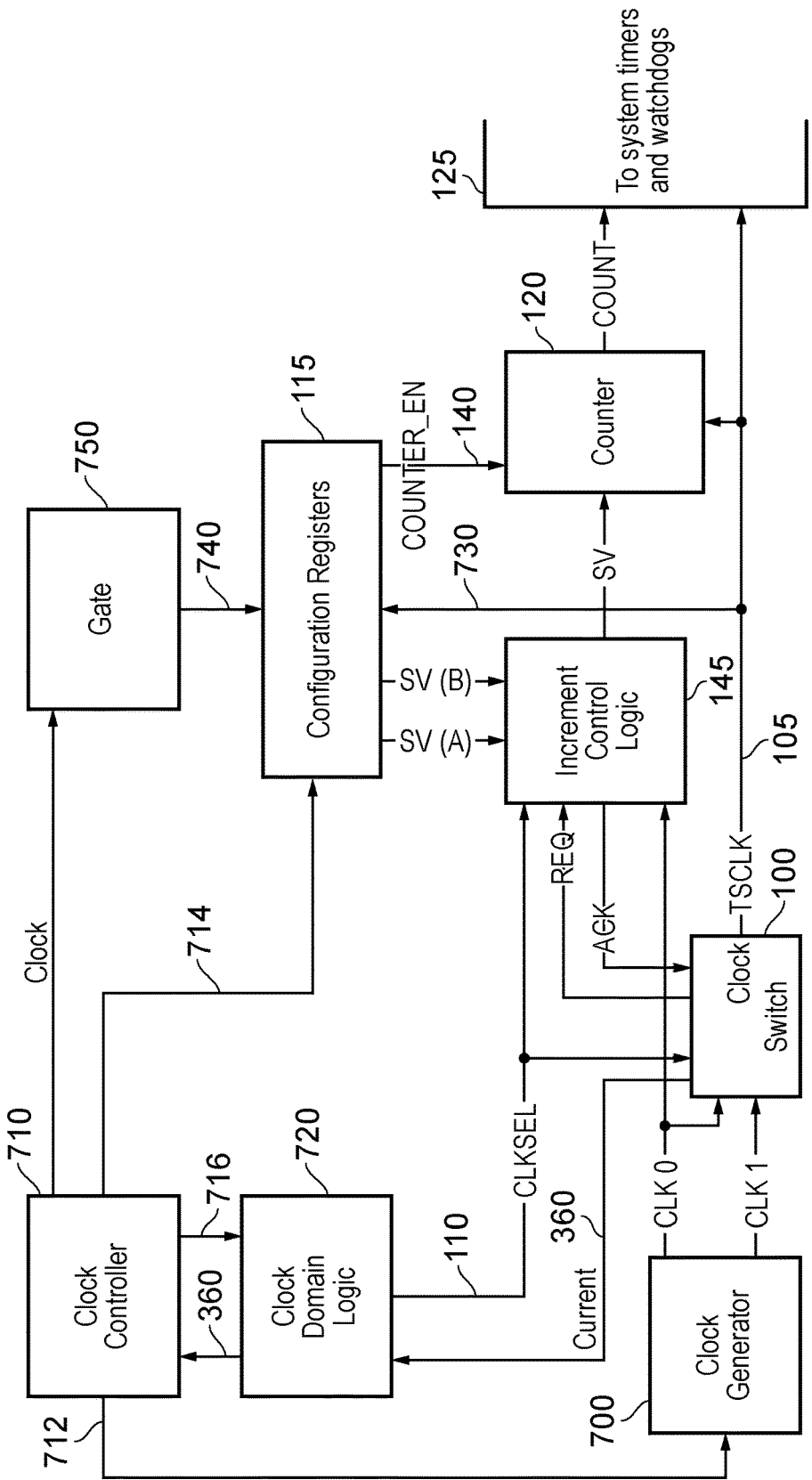
FIG. 7 schematically illustrates another example of a data processing apparatus including clock control circuitry.

FIG. 7 schematically illustrates another example of a data processing apparatus including clock control circuitry.

In FIG. 7, those portions which operate substantially identically to those of FIG. 1 carry identical numerals and will not be described further here.

The candidate clock signals are generated by a clock generator 700 operating under the overall control of a clock controller 710. The clock generator 700 uses an internally provided or externally provided (though not shown) reference clock signal to derive the candidate clock signals, using, for example, a phase locked loop (PLL) arrangement, whereby parameters of the PLL can be specified by the clock controller 710 in order to vary the clock frequency of either or both of the candidate clock signals CLK A or CLK B generated by the clock generator 700.

Clock domain logic circuitry 720 selects which of the candidate clocks should be currently in use and in doing so generates the selection signal 110 for provision to the clock switch 100 and the increment control logic 145. The clock domain logic 720 is also responsive to the current clock output from the clock switch 100, shown in FIG. 3 as the output 360 so as not to initiate a further change in the selection signal 110 until that selection has been shown to be fully implemented by the response of the clock switch 100 indicating that the current clock in use as the signal 105 corresponds to the one most recently selected as the selection signal 110. This is a simple safeguard to avoid the clock domain logic 720 attempting to change the clock signal for the current clock domain too frequently by forcing the clock domain logic 720 to wait at least until its most recently requested change has been fully implemented.

The clock controller 710 can specify the clock frequencies of the candidate clocks CLK A and CLK B as discussed above. In an example arrangement, it can change the clock frequency for that one of the candidate clock signals not currently selected by the clock switch 100. In doing so, it refers to the current clock signal 360 to detect which clock signal is currently in use and can write new parameters to the clock generator 700 in respect of the one or more other clock signals not currently in use. It achieves this by a control signal 712. Similarly, on changing a clock frequency or more than one clock frequency implemented by the clock generator 700, the clock controller 710 writes to the one or more registers holding scaling values appropriate to the newly changed clock frequency, by means of a signal 714.

Optionally, given that the configuration registers 115 may be read without a clock signal but require a clock signal in order to be written to, in place of the clock signal 105 provided as a signal 730 to the configuration registers, a gated clock signal 740 controlled by a clock gate 750 in turn controlled by the clock controller can be used to clock the configuration registers 115 only when they are being written to by the clock controller 710. This can potentially save power consumption by not providing a clock signal to the configuration registers 115 except when they are being written to in order to update one or more scaling values and/or the counter enable signal.

Therefore, in FIG. 7 there is an example of clock generation circuitry 700, 710 to generate the candidate clock signals. The clock generation circuitry 700, 710 is also configured to define the frequencies of the candidate clock signals and to generate the candidate scaling values.

The arrangement of FIG. 7 can operate in accordance with the initialisation flowchart of FIG. 2, as an alternative arrangement or upon system boot. In this regard, the clock controller 710 can write to the appropriate register storing the counter enable signal 140 in order to implement the step 200, disabling the counter for writing the complete set of scaling values to the configuration registers 115. This provides an example of temporarily inhibiting operation of the counter 120 during a storage process of storing the two or more candidate scaling values in the scaling value storage 115.

Figure 8:
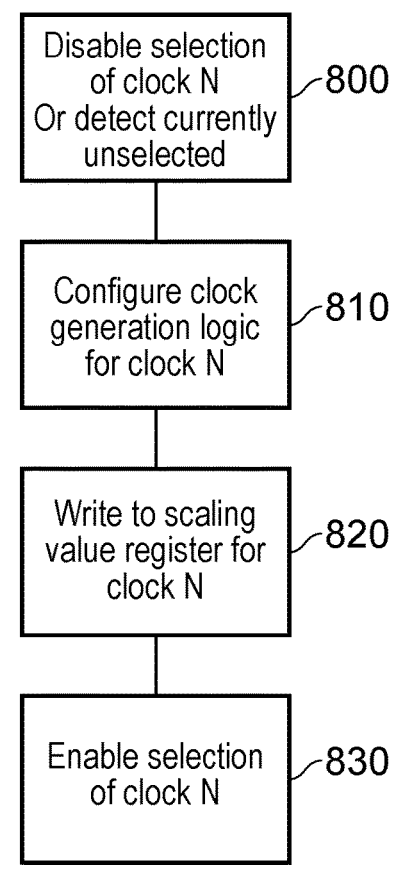
FIG. 8 is a schematic flowchart illustrating a method.

FIG. 8 is a schematic flowchart illustrating some of the operations discussed above. In particular, FIG. 8 provides an example in which a currently not-selected clock signal can be reconfigured using the arrangement of FIG. 7. At a step 800, the clock controller 710 either detects that a particular candidate clock signal (schematically, clock N) is not currently selected or potentially actively disabled the selection of clock N by the clock domain logic, for example using a signal 716.

At a step 810, the clock controller 710 configures the clock generator 700 with regards to clock N, for example by setting PLL parameters to control the frequency of clock N.

At a step 820, the clock controller writes a scaling value appropriate to the newly reconfigured clock N to the configuration registers 115. Finally, assuming that at the step 800 the selection of clock N had been temporarily disabled, the clock controller 710 re-enables selection (at a step 830) by the clock domain logic 720 of the clock N.

FIGS. 9 to 12 schematically illustrate data processing apparatuses as examples of the use of arrangements discussed above. The arrangements shown in FIGS. 9 to 12 represent the circuitry 125 of FIGS. 1 and 7 and receive the count signal generated by the counter 120 and the current clock signal 105 output by the clock switch 100. More than one of these examples may be present in a particular overall system, which is to say that multiple uses can be made of the clock and count signals within a clock domain.

Figure 9:
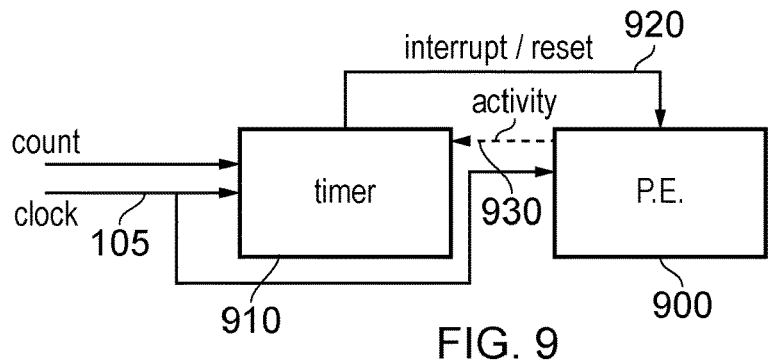
FIGS. 9 to 12 schematically illustrate respective data processing apparatus.
Figure 11:
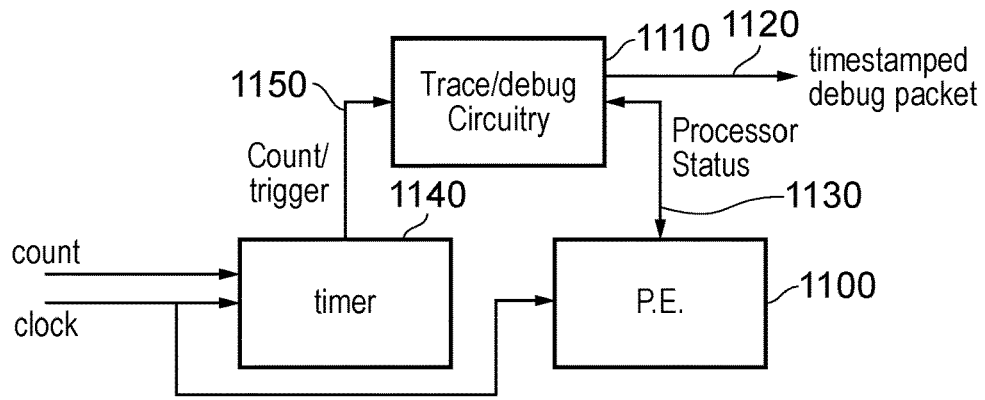
Figure 12:
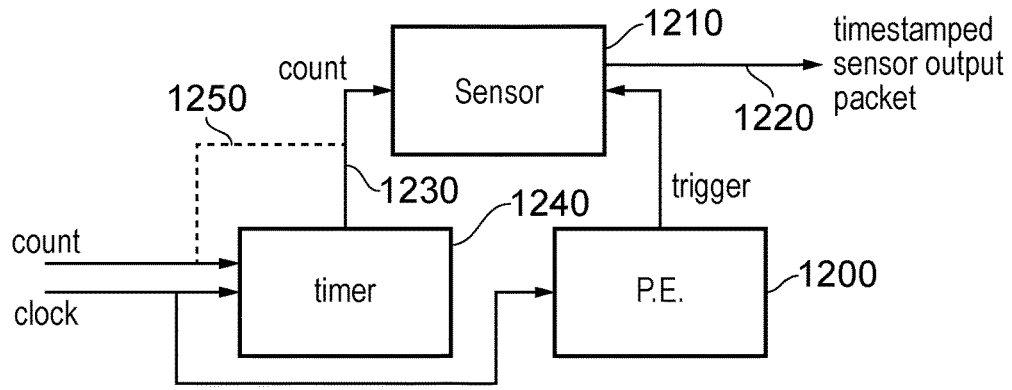

In each of these examples, a processing element is provided to execute successive program instructions. In FIGS. 9, 11 and 12 a processing element 900, 1100, 1200 is shown and in FIG. 10, a so-called graphics processing unit 1000 is shown but in either instance, these provide examples of a processing element to execute successive processing instructions. Note that as discussed above, each of the arrangements of FIGS. 9 to 12 incorporates the other circuitry shown in FIG. 1 or FIG. 7, which is simply omitted from these drawings for clarity.

Again, each of the arrangements of FIGS. 9 to 12 employs a particular example of count processing circuitry to perform a data processing action in response to the count value received from the counter 120.

In the example of FIG. 9, a timer 910 either detects the count value reaching or exceeding a particular threshold and generates a signal such as an interrupt 920 to the processing element 900 or alternatively as a watchdog function, detects a lack of processor activity using a control signal 930 and, if the lack processing activity continues for a predetermined period with respect to the count values, issuing one or both of an interrupt and a reset as the signal 920 to the processing element 900. The interrupt represents an example of a change in program flow initiated by the timer 910.

Figure 10:
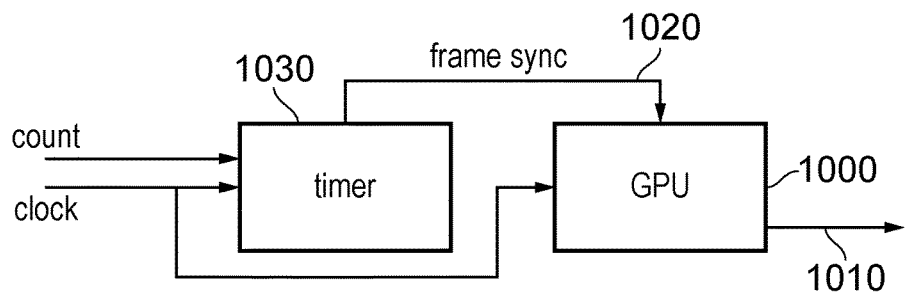

In FIG. 10, the graphics processing unit (GPU) 1000 generates image or video output data 1010 in synchronism with, for example, a frame synchronisation signal 1020 generated by a timer 1030 in response to the count signal from the counter 120 reaching a multiple of a predetermined or other value representing the frame period expressed in units of the count value generated by the counter 120.

Referring to FIG. 11, a trace/debug circuit 1110 generates debug packets 1120 indicative of the status 1130 of the processing element 1100 at particular time points provided by a timer 1140, for example times at which the count value generated by the counter 120 is a multiple of a trace interval. The timer 1140 generates a trigger signal 1150 to initiate generation of a debug packet by the trace/debug circuitry 1110 and also provides the count value at the time that the trigger signal 1150 is generated so that the trace/debug circuitry 1110 can associate the current count value as a time stamp with the relevant debug packet.

In a similar manner, in FIG. 12, a sensor device 1210 such as a temperature sensor, a gas sensor, a proximity sensor or the like generate time stamped sensor output packets 1220 indicative of the sensor output and the time as determined by the prevailing count value when that sensing operation was carried out. The sensor 1210 may be triggered by the processing element 1200 and/or by a trigger signal 1230 from a timer 1240, and may receive the current count value either directly 1250 or via the timer 1240 to incorporate as a time stamp in the output packet.

In the arrangements described above, the clock switch 100 switched between candidate clock signals CLK A and CLK B provided to it as inputs. FIG. 13 schematically illustrates another example of a clock selector or clock switch in which the output clock signal 105 is generated rather than selected.

Referring to FIG. 13, a controller 1300 receives the clock selection signal 110 and controls a parameter setting module 1310 to provide parameters to a phase locked loop (PLL) 1320 which generates the required clock signal 1330 according to the parameters set by the parameter setting module 1310. In doing so, the PLL can be responsive to an internally generated reference signal, a reference signal 1302 generated by the controller 1300 or an externally provided reference signal 1340. A clock gate 1350 gates the clock 1300 to provide the output clock 105. The controller generates the request signal Req and receives the acknowledgement signal Ack as described above and so the effect is that the controller (as part of the clock selector 100 and the increment control logic 145 cooperate to inhibit the output by the gate 1350 of the current clock signal 105 during a scaling value change operation (in this example the inhibition is between the assertion of Req and the reply assertion of Ack) and can also operate to inhibit the output of the current clock signal during a clock signal change operation, for example to allow the PLL to re-lock to the newly required frequency.

FIG. 14 schematically illustrates another example of increment control logic to replace the increment control logic 145 described above.

In FIGS. 1 and 7, the increment control logic 145 selected between scaling values such as SV(A) and SV(B) which are provided in the configuration registers 115. In FIG. 14, a scaling value generator 1400 receives the clock selection signal 110 defining the required frequency of the next clock signal to be generated and outputs an appropriate scaling value 1435 in place of the scaling value 135 in FIG. 1, which it derives as a direct function or from a lock up table of the clock frequency. As before, the increment control logic of FIG. 14 generates the Ack signal and receives the Req signal and also operates under the control of an input clock signal 1410 which is not paused during a clock signal change operation or a scaling value change operation.

FIG. 15 is a schematic flowchart illustrating a method comprising:

selecting and outputting (at a step 1500) a current clock signal from two or more candidate clock signals;

executing (at a step 1510) a clock signal change operation to select a different one of the two or more candidate clock signals for output as the current clock signal;

generating (at a step 1520) a count value by counting clock pulses of the current clock signal multiplied by a scaling value;

executing (at a step 1530) a scaling value change operation to change the scaling value in response to initiation of a clock signal change operation; and inhibiting (at a step 1540) the output of the current clock signal during a scaling value change operation.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function, in which case software or program instructions by which the function is performed, and a providing medium such as a non-transitory machine-readable medium by which such software or program instructions are provided (for example, stored) are considered to represent embodiments of the disclosure. "Configured to" does not imply that the apparatus element needs to be changed in any way in order to provide the defined operation.

Although illustrative embodiments of the present techniques have been described in detail herein with reference to the accompanying drawings, it is to be understood that the present techniques are not limited to those precise embodiments, and that various changes, additions and modifications can be effected therein by one skilled in the art without departing from the scope and spirit of the techniques as defined by the appended claims. For example, various combinations of the features of the dependent claims could be made with the features of the independent claims without departing from the scope of the present techniques.

We claim:

1. Clock signal control circuitry comprising:
   a clock selector to output a current clock signal selected from two or more candidate clock signals and to execute a clock signal change operation to select a different one of the two or more candidate clock signals for output as the current clock signal;
   a counter to generate a count value by counting clock pulses of the current clock signal multiplied by a scaling value; and control logic to execute a scaling value change operation to change the scaling value in response to initiation of a clock signal change operation;

wherein the clock selector and the control logic are configured to cooperate to inhibit the output of the current clock signal during a scaling value change operation.

2. Circuitry according to claim 1, wherein the clock selector is configured to inhibit the output of the current clock signal during a clock signal change operation.

3. Circuitry according to claim 1, comprising:
scaling value storage to store two or more candidate scaling values;
the control logic is configured, as at least a part of a scaling value change operation, to provide a selected one of the candidate scaling values to the counter.

4. Circuitry according to claim 1, configured to temporarily inhibit operation of the counter during a storage process of storing the two or more candidate scaling values in the scaling value storage.

5. Circuitry according to claim 1, comprising:
clock generation circuitry to generate the candidate clock signals;
wherein the clock generation circuitry is configured to define the clock frequencies of the candidate clock signals and to generate the candidate scaling values.

6. Circuitry according to claim 1, wherein:
a respective candidate scaling value corresponds to each of the two or more candidate clock signals; and
the candidate scaling values vary in inverse proportion to the clock frequency of the respective candidate clock signals.

7. Circuitry according to claim 1, wherein the control logic is configured to operate in response to a clock signal which continues during at least a scaling value change operation.

8. Data processing circuitry comprising
circuitry according to claim 1;
a processing element to execute successive program instructions; and
count processing circuitry to perform a data processing action in response to the count value.

9. Data processing circuitry according to claim 7, wherein the data processing action comprises one or more of:
initiating a processor interrupt;
initiating a reset of the processing element;
initiating a change in program flow;
associating a timestamp with a sensor data packet indicative of a sensor detection; and
associating a timestamp with a debug data packet indicative of a current state of the processing element.

10. Clock signal control circuitry comprising:
means for selecting and outputting a current clock signal from two or more candidate clock signals;
means for executing a clock signal change operation to select a different one of the two or more candidate clock signals for output as the current clock signal;
means for generating a count value by counting clock pulses of the current clock signal multiplied by a scaling value;
means for executing a scaling value change operation to change the scaling value in response to initiation of a clock signal change operation; and
means for inhibiting the output of the current clock signal during a scaling value change operation.

11. A method comprising:
selecting and outputting a current clock signal from two or more candidate clock signals;
executing a clock signal change operation to select a different one of the two or more candidate clock signals for output as the current clock signal;
generating a count value by counting clock pulses of the current clock signal multiplied by a scaling value;
executing a scaling value change operation to change the scaling value in response to initiation of a clock signal change operation; and
inhibiting the output of the current clock signal during a scaling value change operation.

\* \* \* \* \*